(12) United States Patent
Weinberg et al.

(10) Patent No.: US 10,484,019 B2
(45) Date of Patent: Nov. 19, 2019

(54) ADAPTIVE ENCODER/DECODER

(71) Applicant: Western Digital Technologies, Inc., San Jose, CA (US)

(72) Inventors: Yoav Weinberg, Ontario (CA); Leonid Minz, Beer Sheva (IL); Shay Benisty, Beer Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 169 days.

(21) Appl. No.: 15/797,722

(22) Filed: Oct. 30, 2017

(65) Prior Publication Data

US 2019/0132007 A1    May 2, 2019

(51) Int. Cl.
| | |
|---|---|
| *H03M 13/00* | (2006.01) |
| *G06F 11/00* | (2006.01) |
| *H03M 13/29* | (2006.01) |
| *G06F 11/10* | (2006.01) |

(52) U.S. Cl.
CPC ..... *H03M 13/2906* (2013.01); *G06F 11/1076* (2013.01)

(58) Field of Classification Search
CPC .. H03M 13/2906; H03M 13/03; H03M 13/05; H03M 13/09; H03M 13/095; H03M 13/096; H03M 13/098; H03M 13/11; H03M 13/1105; H03M 13/15; H03M 13/151; H03M 13/1555; H03M 13/1575; G06F 11/1076; G06F 11/08; G06F 11/14; G06F 11/1402; G06F 11/1608
USPC ............... 714/755, 779, 758, 762, 799, 800
See application file for complete search history.

(56) References Cited

U.S. PATENT DOCUMENTS

| | | | |
|---|---|---|---|
| 5,218,622 A * | 6/1993 | Fazel ................... | H04N 19/50 375/240 |
| 5,280,488 A | 1/1994 | Glover et al. | |
| 5,956,524 A | 9/1999 | Gajjar et al. | |
| 7,127,653 B1 | 10/2006 | Gorshe | |
| 2010/0166052 A1* | 7/2010 | Okuda .................. | H04N 19/91 375/240 |
| 2011/0022922 A1* | 1/2011 | Sharon ................ | G06F 11/1068 714/752 |
| 2019/0149171 A1* | 5/2019 | Kim .................... | H03M 13/1157 |

OTHER PUBLICATIONS

U.S. Appl. No. 15/395,680, filed Dec. 30, 2016 by Benisty et al., entitled "Data Storage at an Access Device."

* cited by examiner

*Primary Examiner* — Christine T. Tu
(74) *Attorney, Agent, or Firm* — Vierra Magen Marcus LLP

(57) ABSTRACT

Technology is described herein for encoding and decoding data. A codeword may be divided into two sub-codewords. A first sub-codeword may be used for data bits and associated parity bits. A second sub-codeword may be used for mode sub-codeword. In one embodiment, the alignments bits are used for the mode sub-codeword. The mode sub-codeword stores mode information, in one aspect. The mode information may indicate how the first sub-codeword should be decoded. The mode information includes a normal mode and a special mode. The format and size of the first sub-codeword may vary depending on the mode. The first sub-codeword may be substantially smaller for the special mode. This can be used to vastly reduce the time needed to initialize memory.

20 Claims, 11 Drawing Sheets

ADAPTIVE ENCODER/DECODER

BACKGROUND

The present disclosure relates to technology for encoding and decoding data.

Once a set of memory cells have been programmed, data may be read from the memory cells by sensing the programmed states of the memory cells. However, sensed programmed states can sometimes vary from the written programmed states due to one or more factors. Error detection and correction algorithms can be used to detect and/or correct data errors resulting from sensed programmed states that do not match written programmed states.

A wide variety of error detection and correction algorithms have been developed. In general, such algorithms involve adding one or more redundant bits to the actual data to be stored. Herein, these redundant bits will be referred to as "parity bits." A wide variety of algorithms may be used to generate the parity bits. The combination of the data bits and parity bits are referred to as a codeword, which is what is stored to the memory cells. When the codeword is read back from the memory cells, typically an inverse of the algorithm is applied to recover the actual data.

Error detection and correction algorithms different in their strength, which refers to the ability to detect and/or correct a certain number of errors per codeword. For example, some error detection and correction algorithms may be able to detect up to two errors and correct a single error in a codeword.

DETAILED DESCRIPTION

Technology is described herein for encoding and decoding data. In many computer architectures, the size of the codewords stored to memory are multiples of some unit. For example, the size of the codewords might be some integer number of bytes. However, the data bits and parity bits for the codeword might not be equal to a multiple of bytes (or some other unit). Thus, there may be some bits left over after the data bits and parity bits have been added to the codeword. These unused bits are referred to herein as "alignment bits," as they are used to align the codeword to some fundamental unit.

In one embodiment, a codeword contains two sub-codewords. A first sub-codeword may be used for data bits and associated parity bits. A second sub-codeword may be used for mode sub-codeword. In one embodiment, the alignments bits are used for the mode sub-codeword. The mode sub-codeword stores mode information, in one embodiment. The mode information may indicate how the first sub-codeword should be decoded.

The mode information includes a normal mode and a special mode, in one embodiment. In one embodiment, the format and size of the first sub-codeword varies depending on the mode. In one embodiment of the normal mode, "m" data bits and "n" parity bits are encoded into the first sub-codeword. In one embodiment of the special mode, a total of "n" bits are encoded for data and parity bits into the first sub-codeword. When decoding, the mode sub-codeword may be decoded to determine whether the first sub-codeword was encoded in the normal mode or the special mode. The first sub-codeword may then be decoded accordingly.

As noted, the format and size of the first sub-codeword may vary depending on the mode. The first sub-codeword may be substantially smaller for the special mode. This can be used to vastly reduce the time needed to initialize memory. Initializing memory, as the term is used herein, means to establish values for various locations in memory. In some embodiments, memory locations are initialized without actually storing any information to those locations. This may be achieved in one embodiment of the special mode. In one embodiment, the data in the first sub-codeword for the special mode indicates what values should be used for a location in memory that is being initialized (but not written to). For example, rather that write "m" bits of data to the location in memory being initialized, a smaller codeword is written in the special mode. This smaller codeword contains information that specifies how the location in memory is to be initialized. Upon decoding the smaller codeword, the information may be used to determine what values to return for the "m" bits of data corresponding to the location in memory that were initialized. Note that the smaller codeword may be a fraction of the size of the "m" bits. Hence, the memory can be initialized much faster than by actually writing data to the locations to be initialized.

Figure 1:
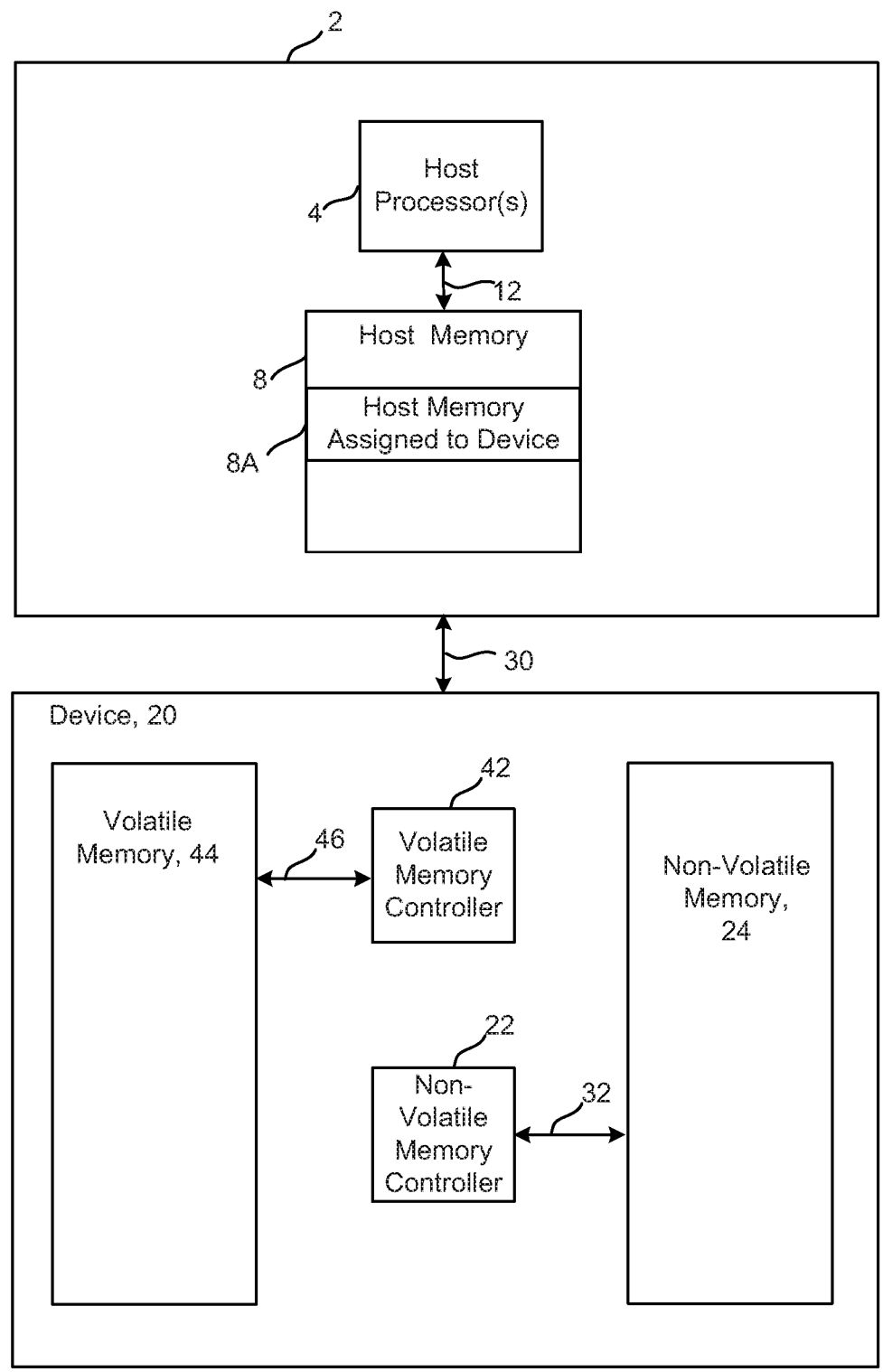
FIG. 1 is an example system in which embodiments may be practiced.

FIG. 1 is an example system in which embodiments may be practiced. A device 20 is connected to a host 2 through interface 30. Host 2 also includes host processor 4, which is connected to host memory 8 through but 12. In one embodiment, the host processor(s) 4 include an application processor. The application processor may perform functions needed to support applications, including memory management, graphics processing and multimedia decoding. Host memory 8 could include any combination of volatile (e.g., RAM) or non-volatile memory (e.g., ROM). A portion of host memory 8 may store software applications to execute on the host processor(s) 4. A portion of host memory 8 is assigned to the device 20. This portion is for the device 20 to use.

The device 20 may be embedded within an apparatus containing the host 2. For example, the device 20 might be embedded in a smartphone, personal digital assistant (PDA), laptop computer, notebook computer, set top box, camera, etc. In one embodiment, the host environment is an automobile. The host 2 may perform the functions of the smartphone, PDA, laptop computer, notebook computer, set top box, camera, automobile's electronic system, etc. Note that the host could thus be considered to be the apparatus such as the smartphone, personal digital assistant (PDA), laptop computer, notebook computer, set top box, camera. Thus, when the device 20 is embedded within such an apparatus, this may be referred to as embedding the device 20 within the host. However, the device 20 is not required to be embedded within the host. For example, the device 20 may be connectable to a host via an external port (e.g., USB, SCSI, etc.) of the host. In some embodiments, the device 20 is a memory device. The device 20 may be, for example, a Universal Flash Storage (UFS) device, embedded multimedia card (eMMC) memory device, MMC memory device, solid state drive (SSD), Memory Stick, Secure Digital (SD) memory card, CompactFlash (CF) storage device, USB flash drive, etc. However, device 20 is not required to be a memory device. For example, device 20 might be any application specific integrated circuit (ASIC). As one example, the device 20 might be a graphics card.

Device 20 includes volatile memory controller 42 in communication with volatile memory 44. In one embodiment, volatile memory 44 can be implemented using one or multiple memory die. Interface 46 between volatile memory controller 42 and volatile memory 44 may be any suitable interface. In one embodiment, volatile memory 44 is DRAM. The volatile memory controller 42 has an encoder to form codewords, which are stored in volatile memory 44, in one embodiment. The volatile memory controller 42 has a decoder to decoder the codewords, in one embodiment. In one embodiment, the codewords have multiple sub-codewords, wherein one of the sub-codewords is a mode sub-codeword. Volatile memory controller 42 may also store the codewords to host memory 8.

Figure 3A:
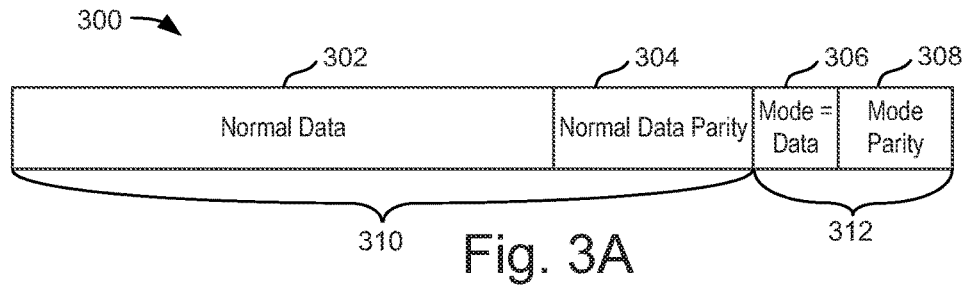
FIGS. 3A and 3B are example codewords, in accordance with one embodiment.
Figure 3B:
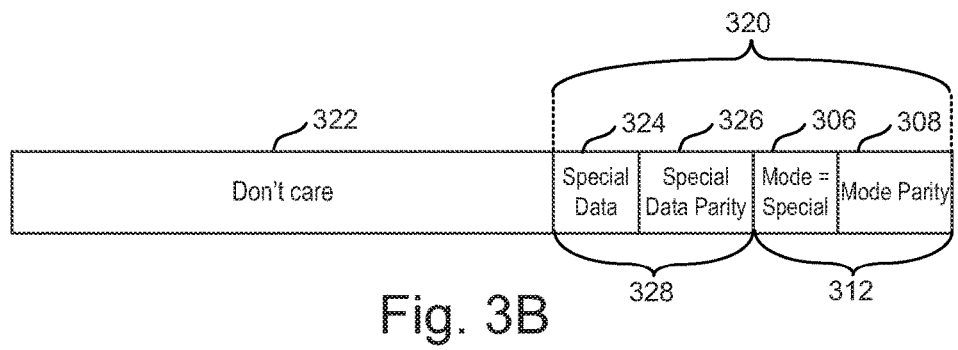

The volatile memory controller 42 forms the codewords depicted in FIGS. 3A and 3B, in one embodiment. The volatile memory controller 42 performs process 500 of FIG. 5, in one embodiment. The volatile memory controller 42 performs process 800 of FIG. 8, in one embodiment. The volatile memory controller 42 contains system 600 of FIG. 6, in one embodiment. The volatile memory controller 42 contains system 900 of FIG. 9, in one embodiment. At least a region of volatile memory 44 is organized in accordance with the example of FIG. 7A, in one embodiment. At least a region of volatile memory 44 is organized in accordance with the example of FIG. 7B, in one embodiment. At least a region of volatile memory 44 is organized in accordance with the example of FIG. 10, in one embodiment. Host memory region 8A is organized in accordance with the example of FIG. 7A, in one embodiment. Host memory region 8A is organized in accordance with the example of FIG. 7B, in one embodiment. Host memory region 8A is organized in accordance with the example of FIG. 10, in one embodiment.

Device 20 includes non-volatile memory controller 22 in communication with non-volatile memory 24. In one embodiment, non-volatile memory 24 can be implemented using one or multiple memory die. Interface 32 between memory controller 22 and non-volatile memory 24 may be any suitable interface. In one embodiment, the non-volatile memory 24 is a NAND memory and interface 32 is compliant with a version of the Open NAND Flash Interface (ONFI). However, non-volatile memory 24 is not limited to NAND. Non-volatile memory 24 is NOR in one embodiment. Non-volatile memory 24 is resistive random-access memory (ReRAM), in one embodiment. Non-volatile memory 24 is magnetic storage (such as a hard disk drive), in one embodiment. Non-volatile memory 24 could be another type of memory. In one embodiment, non-volatile memory 24 includes a two-dimensional array of non-volatile memory cells. In one embodiment, non-volatile memory 24 includes a three-dimensional array of non-volatile memory cells.

The non-volatile memory controller 22 forms the codewords depicted in FIGS. 3A and 3B, in one embodiment. The non-volatile memory controller 22 performs process 500 of FIG. 5, in one embodiment. The non-volatile memory controller 22 performs process 800 of FIG. 8, in one embodiment. The non-volatile memory controller 22 contains system 600 of FIG. 6, in one embodiment. The non-volatile memory controller 22 contains system 900 of FIG. 9, in one embodiment. At least a region of non-volatile memory 24 is organized in accordance with the example of FIG. 7A, in one embodiment. At least a region of non-volatile memory 24 is organized in accordance with the example of FIG. 7B, in one embodiment. At least a region of non-volatile memory 24 is organized in accordance with the example of FIG. 10, in one embodiment.

The host 2 and device 20 communicate through interface 30. The interface 30 represents a path that permits signals to transfer information (e.g., data, commands, etc.) between the device 20 and host 2. The interface 30 could include a physical connection (e.g., electrically conductive wires or traces, optical waveguides, etc.) or be wireless. The signals could be transmitted via electrical voltage, electrical current, optical signal, electromagnetic radiation, etc. The physical nature of the interface 30 (e.g., number of conductive lines, definition of each conductive line, timing of signals over the conductive lines, etc.) may comply with a wide variety of technologies and/or protocols. Interface 30 may comply with, for example, multi-media card (MMC), eMMC, Universal Flash Storage (UFS), Small Computer Systems Interface (SCSI), non-volatile memory express (NVMe), Peripheral Component Interconnect Express (PCIe), Universal Serial Bus (USB) interface, Bluetooth interface, etc.

Note that the host 2 and device 20 may each have hardware and/or software to enable communication over the interface 30. Herein, the term "software" refers to the combination of processor executable instructions and a processor that executes the processor executable instructions to implement the functionality of the software. The processor executable instructions are stored in non-transitory storage. The processor is sometimes referred to as a "microprocessor."

For example, device 20 may have a device interface that contains logic (e.g., hardware and/or software) thereon to control the transfer of signals over the interface 30. Such logic in the device interface may also generate the signals to be transmitted over the interface 30 and receive and decode the signals received over the interface 30. Likewise, host 2 may contains logic thereon to control the transfer of signals over the interface 30. The logic in the host 2 may also generate the signals to be transmitted over the interface 30 and receive and decode the signals received over the interface 30.

In one embodiment, the host has a host logical address space. The host 2 may send requests over the interface 30 to write or read data to/from the non-volatile memory 24. The host may specify a logical address in such non-volatile memory access requests. The non-volatile memory controller 22 may translate the logical address to a physical address within the non-volatile memory 24, and send a command to the non-volatile memory 24 to write or read data to/from that physical address.

Figure 2A:
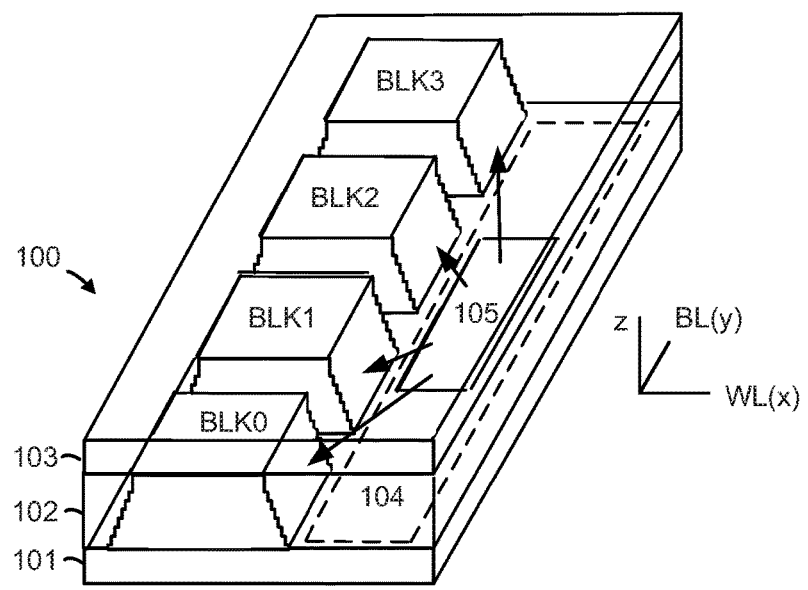
FIG. 2A is a perspective view of a set of blocks in a 3D stacked non-volatile memory device.

The non-volatile memory 24 in FIG. 1 may be a variety of types of memory. One example is a 3D stacked non-volatile memory device. FIG. 2A is a perspective view of a set of blocks in a 3D stacked non-volatile memory system 100. The memory system 100 is one embodiment of device 20 of FIG. 1. The memory system 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 2B:
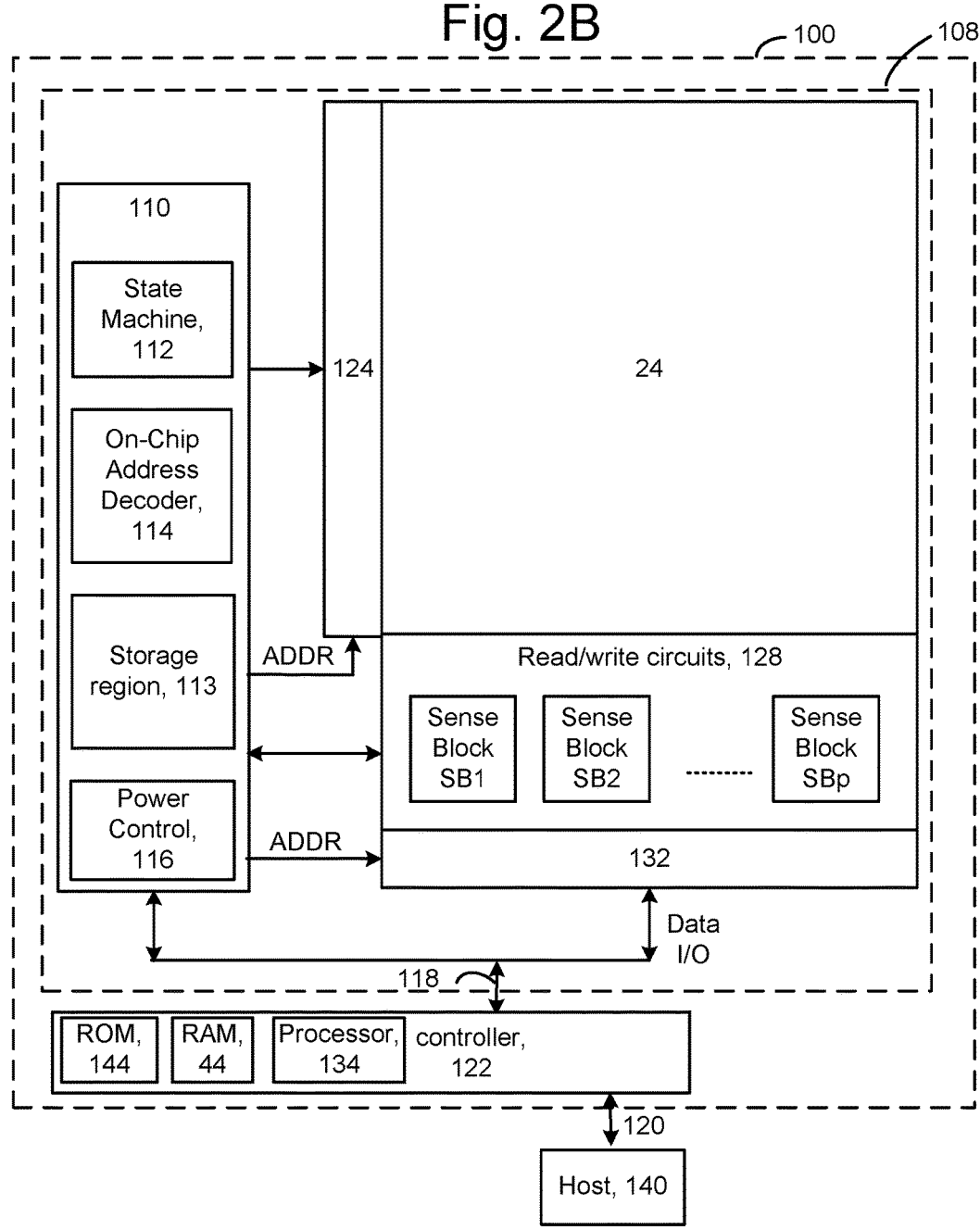
FIG. 2B is a functional block diagram of a memory device such as the 3D stacked non-volatile memory system 100 of FIG. 2A.

FIG. 2B is a functional block diagram of a memory device such as the 3D stacked non-volatile memory system 100 of FIG. 2A. The memory system 100 may include one or more memory die 108. The set of blocks of FIG. 2A can be on one die. The memory die 108 includes non-volatile memory 24, which may be referred to as a memory structure 24. The memory structure 24 includes memory cells, such as an array of memory cells, control circuitry 110, and read/write circuits 128. In a 3D configuration, the memory structure can include the blocks of FIG. 2A. The memory structure 24 is addressable by word lines via a row decoder 124 and by bit lines via a column decoder 132. The read/write circuits 128 include multiple sense blocks SB1, SB2, . . . ,SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118. Note that controller 122 may control both non-volatile memory 24 on memory die 108, as well as volatile memory (e.g., RAM 44). Hence, controller 122 may include both a volatile memory controller 42 and a non-volatile memory controller 22, although those elements are not expressly depicted in FIG. 2B.

The memory structure can be 2D or 3D. The memory structure may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 24, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 24, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 138 and storage devices (memory) such as ROM 144 and RAM 44. The storage devices comprises code such as a set of instructions, and the processor is operable to execute the set of instructions to provide the functionality described herein. Alternatively or additionally, the processor can access code from a storage device of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 138 fetches the boot code from the ROM 144 or storage device for execution, and the boot code initializes the system components and loads the control code into the RAM 44. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

One of skill in the art will recognize that this technology is not limited to the two dimensional and three dimensional exemplary structures described but covers all relevant memory structures within the spirit and scope of the technology as described herein and as understood by one of skill in the art.

Figure 2C:
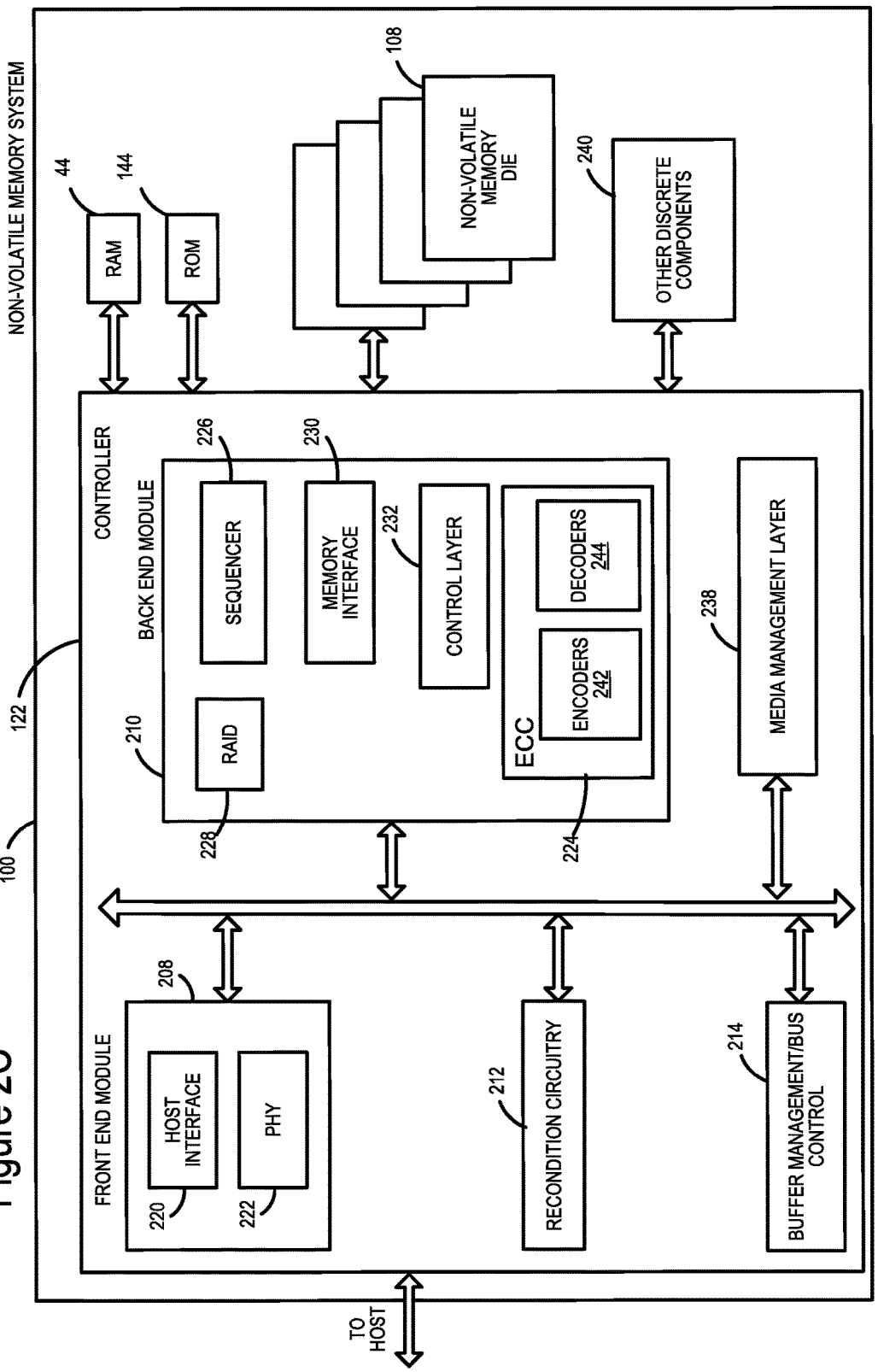
FIG. 2C is a block diagram of example memory system 100, depicting more details of Controller 122.

FIG. 2C is a block diagram of example memory system 100, depicting more details of Controller 122. Note that controller 122 include a non-volatile memory controller and a volatile memory controller, in one embodiment. In one embodiment, the system of FIG. 2C is a solid state drive. As used herein, a memory Controller is a device that manages data stored in memory. The memory Controller may communicate with a host, such as a computer or electronic device. A memory Controller can have various functionality in addition to the specific functionality described herein. For example, the memory Controller can format the memory to ensure the memory is operating properly, map out bad memory cells, and allocate spare memory cells to be substituted for future failed cells. Some part of the spare cells can be used to hold firmware to operate the flash memory Controller and implement other features. In operation, when a host needs to read data from or write data to the memory, it will communicate with the memory Controller. If the host provides a logical address (LA) to which data is to be read/written, the memory Controller can convert the logical address received from the host to a physical address in the memory. (Alternatively, the host can provide the physical address). The memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable interface. In one embodiment, the interface between Controller 122 and non-volatile memory die 108 is a flash interface. In one embodiment, the interface between Controller 122 and non-volatile memory die 108 is compliant with a version of Open NAND Flash Interface (ONFI). In one embodiment, memory system 100 may be a card based system, such as a secure digital (SD) or a micro secure digital (micro-SD) card. In an alternative embodiment, memory system 100 may be part of an embedded memory system. For example, the memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 2C, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 2C may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 2C is one example implementation that may (or may not) use the components of Controller 122 depicted in FIG. 2B (i.e. RAM, ROM, processor).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 44 and controls the internal bus arbitration of Controller 122. A read only memory (ROM) 144 stores system boot code. Although illustrated in FIG. 2C as located separately from the Controller 122, in other embodiments one or both of the RAM 44 and ROM 144 may be located within the Controller. In yet other embodiments, portions of RAM and ROM may be located both within the Controller 122 and outside the Controller. Further, in some implementations, the Controller 122, RAM 44, and ROM 144 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. The ECC engine 224 has one or more encoders 242 and one or more decoders 244. In one embodiment, the ECC engine 224 comprises a low-density parity check (LDPC) decoder. In one embodiment, the ECC engine 224 uses cyclic redundancy check (CRC) codes. In one embodiment, the ECC engine 224 uses Bose-Chaudhuri-Hocquenghem (BCH) codes. An output of the one or more decoders 244 may be provided to the host. However, note that the device 20 itself may be the consumer of the decoder output. For example, the decoders may be used to decode memory management information in RAM. In one embodiment, ECC engine 224 performs one or more steps of process 500 of FIG. 5. In one embodiment, ECC engine 224 performs one or more steps of process 800 of FIG. 8. In one embodiment, ECC engine 224 includes system 600 of FIG. 6. In one embodiment, ECC engine 224 includes system 900 of FIG. 9.

One or more of the encoders 242 may be used when writing information to RAM 44. One or more of the decoders 244 may be used when reading the information from RAM 44. One or more of the encoders 242 may be used when writing information to memory die 108. One or more of the decoders 244 may be used when reading the information from memory die 108. In one embodiment, one or more of the encoders 242 are used when writing information to a region of host memory 8A assigned to the device 20. In one embodiment, one or more of the decoders 244 are used when reading information from a region of host memory 8A assigned to the device 20.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. The memory interface 230 could include a physical connection (e.g., electrically conductive wires or traces, optical waveguides, etc.) or be wireless. The signals could be transmitted via electrical voltage, electrical current, optical signal, electromagnetic radiation, etc. The physical nature of the interface 230 (e.g., number of conductive lines, definition of each conductive line, timing of signals over the conductive lines, etc.) may comply with a wide variety of technologies and/or protocols. The memory interface 230 could also include hardware and/or software to implement a data transfer protocol. In one embodiment, memory interface 230 may be a double data rate (DDR) interface. A control layer 232 controls the overall operation of back end module 210. In one embodiment, the non-volatile memory die 108 contain flash memory cells, and the control layer 232 is a flash control layer.

The memory interface 230 also provides commands and data to RAM 44 instructing the RAM 44 to write the data, as well as commands to RAM 44 to read data. RAM 44 has circuitry to write and read the data. Thus, memory interface 230 sends and receives data to/from RAM 44. The memory interface 230 may also provide commands and data to host 2 to read and write host region 8A. The memory interface 230 may be configured to transfer data in accordance with a double data rate (DDR) synchronous dynamic random-access memory (SDRAM) interface. For example, memory interface 230 may be configured to transfer data in accordance with DDR2 SDRAM, DDR3 SDRAM, DDR4 SDRAM, etc.

Additional components of system 100 illustrated in FIG. 2C include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Media Management Layer (MML) 238 may be integrated as part of the management that may handle errors when reading memory 108 and interfacing with the host. In one embodiment, the MML is a Flash Translation Layer (FTL). For example, MML may be a module in flash management and may be responsible for the internals of NAND management. The MML 238 may include an algorithm in the memory device firmware which translates writes from the host into writes to the memory of die 108. The MML 238 may be needed because: 1) the memory may have limited endurance; 2) the memory may only be written in multiples of pages; and/or 3) the memory may not be written unless it is erased as a block. The MML 238 understands these potential limitations of the memory which may not be visible to the host. Accordingly, the MML 238 attempts to translate the writes from host into writes into the memory 108.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

FIGS. 3A and 3B are example codewords, in accordance with one embodiment. FIG. 3A is a normal codeword 300 that is formed for what is referred to herein as a "normal mode." FIG. 3B shows a special codeword 320 that is formed for what is referred to herein as a "special mode." One embodiment of volatile memory controller 42 forms the codewords 300, 320, as well as decodes the codewords 300, 320. One embodiment of non-volatile memory controller 22 forms the codewords 300, 320, as well as decodes the codewords 300, 320. The codewords 300, 320 could be stored by in volatile memory. For example, volatile memory controller 42 could store the codewords 300, 320 in volatile memory 44 or host memory 8 (in for example, host memory assigned to device 8A). However, note that the codewords 300, 320 could also be stored in non-volatile memory. For example, non-volatile memory controller 22 could store the codewords 300, 320 in non-volatile memory 24. Thus, note that the codewords 300, 320 could be encoded and decoded by an entity other than volatile memory controller 42.

Referring to FIG. 3A, the normal codeword 300 is divided into two sub-codewords, each of which is protected by its own parity. The normal codeword 300 has a normal data sub-codeword 310 and a mode sub-codeword 312. Normal data sub-codeword 310 has normal data 302 and normal data parity 304. The term "normal data" is used with respect to sub-codeword 310 to distinguish from the "special data" sub-codeword 328, to be discussed with respect to FIG. 3B. The device 20 has an encoder to generate the normal data parity 304 based on the normal data 302, in one embodiment. The device 20 has a decoder that decodes the normal data sub-codeword 310 to determine the normal data 302, in one embodiment.

Mode sub-codeword 312 has mode information 306 and mode parity 308. The mode information includes at least one bit. Thus, there is at least a first mode and a second mode. There could be more than one bit of mode information, and hence more than two modes. There is one or more mode parity bits. In the example of FIG. 3A, the mode information is listed as "Mode=Data" to indicate the data mode. The device 20 has an encoder to generate the mode parity 308 based on the mode information 306, in one embodiment. The device 20 has a decoder that decodes the mode sub-codeword 312 to determine the mode information 306, in one embodiment. In one embodiment, the mode sub-codeword 312 occupies what are referred to herein as "alignment bits."

Referring to FIG. 3B, the special codeword 320 is divided into two sub-codewords, each of which is protected by its own parity. The special codeword 320 has a special data sub-codeword 328 and a mode sub-codeword 312. In the example of FIG. 3B, the mode information is listed as "Mode=Special," which specifies the special mode. Note that the same reference numerals are used for the mode sub-codeword 312, mode information 306, and mode parity 308, as were used in the example of FIG. 3A. Thus, although the bit values in the mode information 306 are different in the special mode than the data mode, the meaning of the bits is the same. Also note that the same encoder may be used to form the mode sub-codeword 312 in each case. Likewise, the same decoder may be used to decode the mode sub-codeword 312 in each case.

The special data sub-codeword 328 includes special data 324 and special data parity 326. The special data includes one or more bits of special data. This special data may be used to indicate some special functionality that the device 20 is to perform responsive to decoding the special codeword 320. In one embodiment, the special functionality is to return a special data pattern for a memory location irrespective of what is stored at that memory location. For example, the special functionality can be used to initialize memory to zero, as will be discussed more fully below. The special functionality can be used to trigger an exception, as will be discussed more fully below.

The special data parity 326 includes one or more bits of parity (for the special data 324). The device 20 has an encoder to generate the special data parity 326 based on the special data 324, in one embodiment. The device 20 has a decoder that decodes the special data sub-codeword 328 to determine the special data 324, in one embodiment. In one embodiment, the total size of the special data sub-codeword 328 is equal to the total size of the normal data parity 304. In one embodiment, the normal data 302 is "m" bits, the normal data parity 304 is "n" bits, and the special data sub-codeword 328 is "n" bits.

There are "Don't Care" 322 bits depicted in FIG. 3B. These are not actually part of the special codeword 320. Moreover, the number of Don't Care" 322 bits is equal to the number of Normal Data 302 bits, in one embodiment. In one embodiment, the device 20 generates a data pattern for the Don't Care 322 bits, based on the special data 324. Further details are discussed below.

Figure 4:
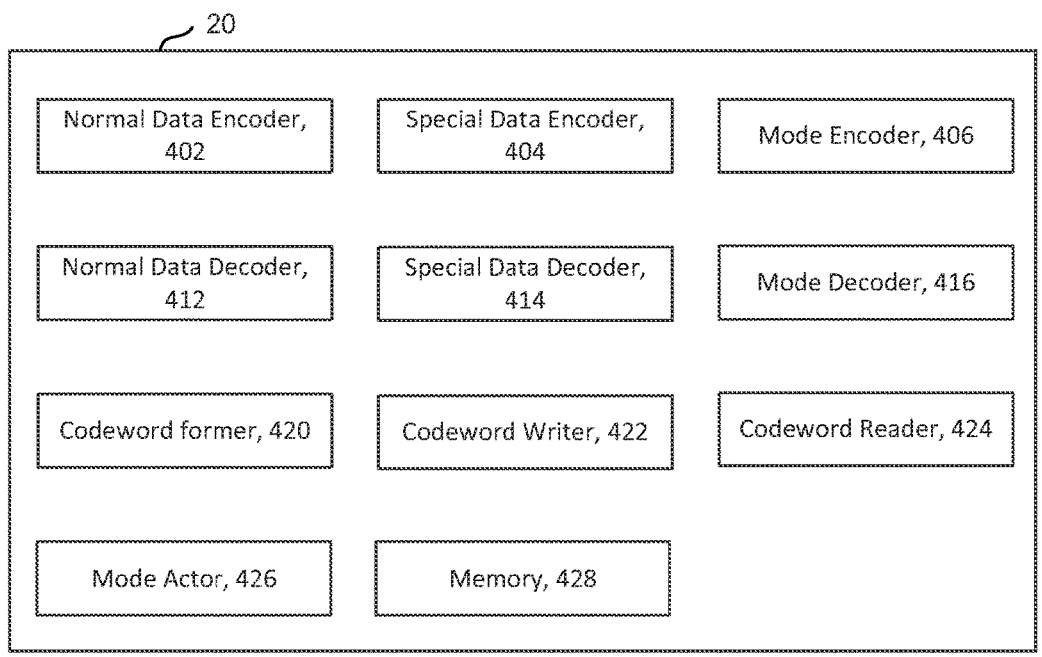
FIG. 4 is a block diagram of one embodiment of device 20 of FIG. 1.

FIG. 4 is a block diagram of one embodiment of device 20 from FIG. 1. The normal data encoder 402 is configured to input "m" bits of normal data 302 and generate an "m+n" bit normal data codeword 310, which includes "n" bits of normal data parity 304, in one embodiment. The special data encoder 404 is configured to input special data, and generate an "n" bit special data sub-codeword 328 that includes the special data 324 and special data parity 326, in one embodiment. The mode encoder 406 is configured to input mode information 306 and generate a mode sub-codeword 312 that includes the mode information 306 and mode parity 308, in one embodiment.

The normal data decoder 412 is configured to input an "m+n" bit normal data sub-codeword 310 and determine "m" bits of normal data 302, in one embodiment. The special data decoder 414 is configured to input an "n" bit special data sub-codeword 328, and determine the special data 324, in one embodiment. The mode decoder 416 is configured to input a mode sub-codeword 312 and determine the mode information 306, in one embodiment.

The encoders 402, 404, 406 are LDPC encoders, in one embodiment. The encoders 402, 404, 406 generate CRC codes, in one embodiment. The encoders 402, 404, 406 generate BCH codes, in one embodiment. The decoders 412, 414, 416 are LDPC decoders, in one embodiment. The decoders 412, 414, 416 decode CRC codes, in one embodiment. The decoders 412, 414, 416 decode BCH codes, in one embodiment. The encoders and decoders are not limited to these examples.

The codeword former 420 is configured to form a normal codeword 300 from a normal data sub-codeword 310 and an associated mode sub-codeword 312, in one embodiment. The codeword former 420 is also configured to form a special codeword 320 from a special data sub-codeword 328 and an associated mode sub-codeword 312, in one embodiment.

The codeword writer 422 is configured to write normal codewords 300 and special codewords 310 to memory, in one embodiment. Note that the don't care bits 322 referenced in the example of FIG. 3B are not stored to memory along with the special codeword 320. Thus, a special codeword 320 can be written to memory using "m" fewer bits, using the example in which there are "m" data bits. Thus, the special codeword 320 can be written to memory much faster than the normal codeword 300. The codeword writer 422 may write the codewords 300, 320 to memory 428, which could be volatile 44 or non-volatile memory 24. In one embodiment, codeword writer 422 writes the codewords 300, 320 to volatile memory 44. In one embodiment, codeword writer 422 writes the codewords 300, 320 to non-volatile memory 24. Note that the codewords 300, 320 can be written to memory external to the device 20. In one embodiment, codeword writer 422 writes the codewords 300, 320 to host memory 8.

The codeword reader 424 is configured to read codewords 300, 320 from memory. In one embodiment, when reading a special codeword 320, the codeword reader also reads some additional bits in memory that correspond to the don't care bits 322. This is because the codeword reader 424 might not know whether the codeword is a special codeword 320 or a normal codeword 300. Hence, the codeword reader 424 may read a sufficient amount of memory to handle the possibility that the codeword is a normal codeword 300, having normal data. If the codeword turns out to be a special codeword 320, the don't care bits are ignored, in one embodiment.

Note that to write the codewords to memory, the codeword writer 422 may send an instruction or command to the memory. Thus, the codeword writer 422 can be implemented by memory interface 230, for example. The codeword writer 422 can also be implemented, at least in part, by interface 30, in one embodiment. Likewise, to read the codewords from memory, the codeword reader 424 may send an instruction or command to the memory. Thus, the codeword reader 424 can also be implemented by memory interface 230 and/or interface 30. The memory interface 230 may be configured to communicate and transfer data in accordance with a double data rate (DDR) synchronous dynamic random-access memory (SDRAM) interface. For example, memory interface 230 may be configured to communicate and transfer data in accordance with DDR2 SDRAM, DDR3 SDRAM, DDR4 SDRAM, etc. The memory interface 230 is not limited to these example interfaces.

The mode actor 426 is configured to take some action based on the special data in the event that the codeword read from memory is a special codeword 320. In one embodiment, the mode actor 426 generates a data pattern for the don't care bits 322. The mode actor 426 could be implemented by executing instructions (that may be stored in ROM 144) on processor 134. The mode actor 426 could be implemented with a state machine, such as state machine 112.

The components (e.g., 402-426) of device 20 depicted in FIG. 4 (other than memory 428) may take the form of a packaged functional hardware unit (e.g., an electrical circuit) designed for use with other components, program code (e.g., software or firmware) executable by a (micro) processor or processing circuitry that usually performs a particular function of related functions, or a self-contained hardware or software component that interfaces with a larger system. For example, one or more of the components may include an application specific integrated circuit (ASIC), a Field Programmable Gate Array (FPGA), an electrical circuit, a digital logic circuit, an analog circuit, a combination of discrete circuits, gates, or any other type of hardware or combination thereof. Alternatively or in addition, one or more of the components may include software stored in a processor readable device (e.g., memory) to program a processor to perform the functions described herein.

Figure 5:
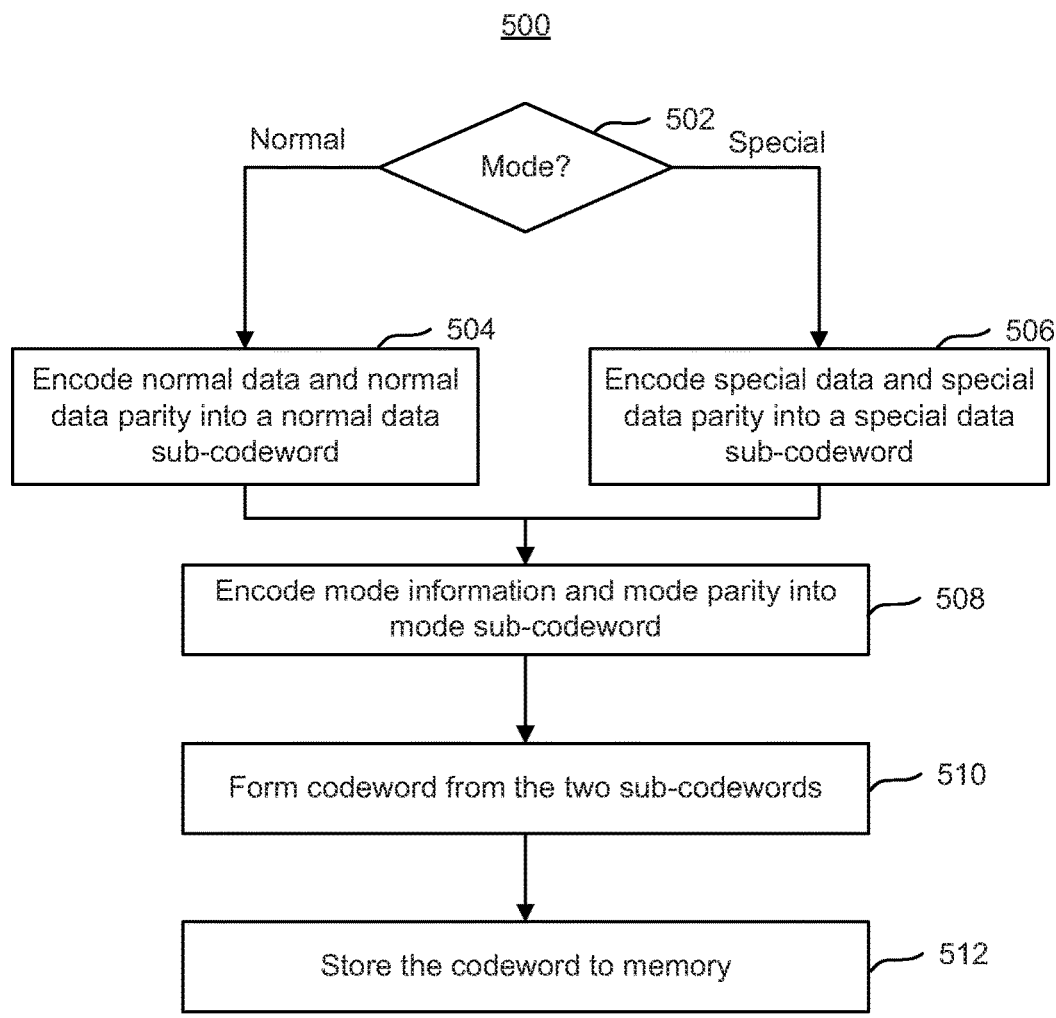
FIG. 5 is a flowchart of one embodiment of a process of encoding data.

FIG. 5 is a flowchart of one embodiment of a process 500 of encoding data. The process 500 may be performed by one or more of volatile memory controller 42, non-volatile memory controller 22, controller 122, normal data encoder 402, special data encoder 404, mode encoder 406, codeword former 420, and/or codeword writer 422. When describing process 500, steps will be described as being performed by device 20.

Figure 6:
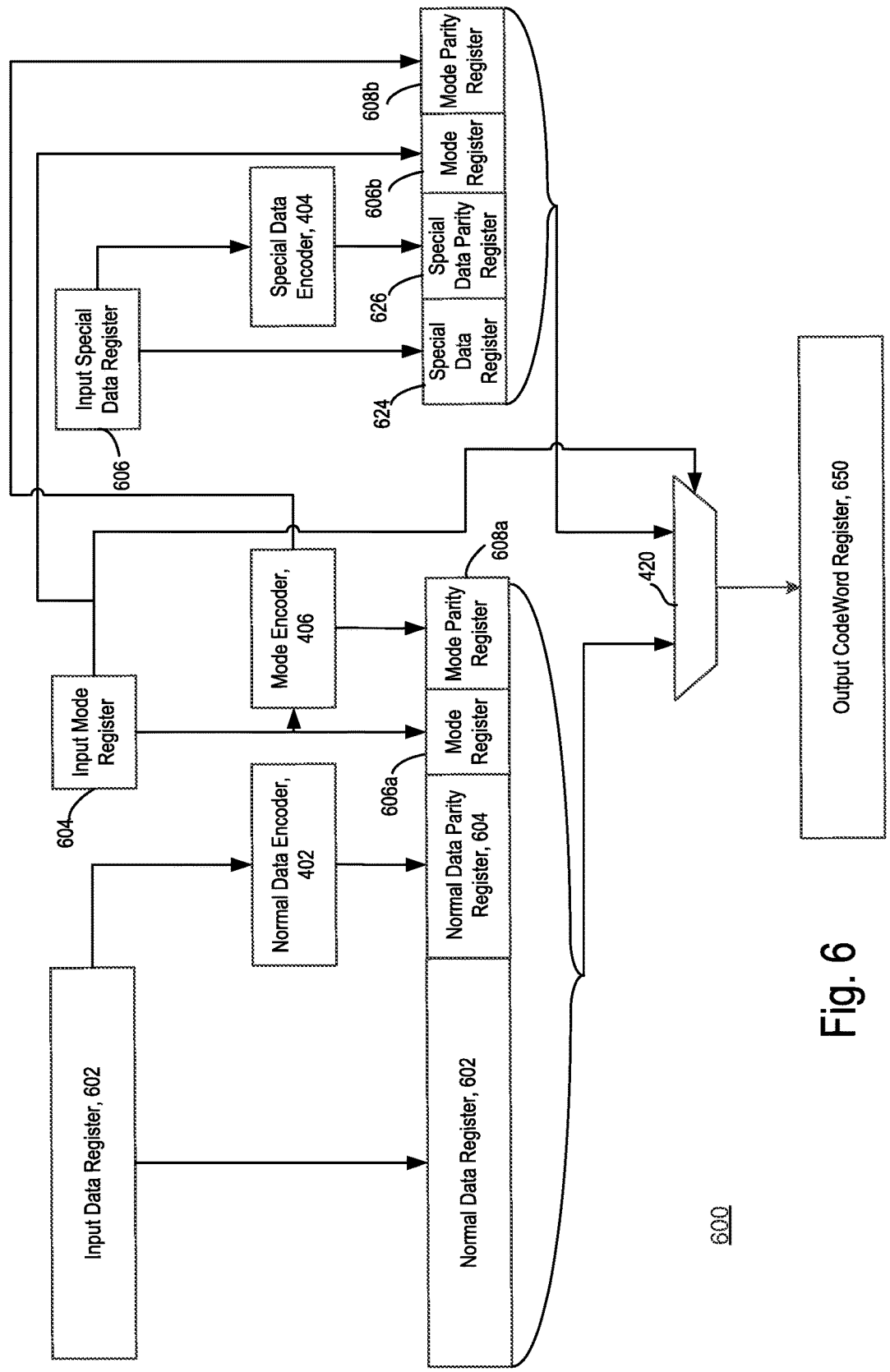
FIG. 6 depicts one embodiment of a system for codeword generation.

When describing process 500, reference will be made to FIG. 6, which depicts one embodiment of a system 600 for codeword generation. Briefly, FIG. 6 shows a normal data encoder 402, special data encoder 404, mode encoder 406, and codeword former 420. The codeword former 420 includes a multiplexer, in this embodiment. The input data register 602, input mode register 604, and input special data register 606 are registers or the like, which are used to store various information. Various other registers in FIG. 6 are used to hold values for the example codewords 300, 320 in FIGS. 3A and 3B. Normal Data Register 602 is used to hold the normal data 302. Normal Data parity Register 604 is used to hold the normal data parity 304. Mode registers 606a, 606b are used to hold mode information 306. Mode parity registers 608a, 608b are used to hold mode parity 308. Special data register 624 is used to hold special data 324. Special data parity register 626 is used to hold special data parity 326. The output codeword register 650 is used to hold either a normal codeword 300 or special codeword 320, depending on the mode.

Step 502 is a decision based on the mode. The mode includes a normal mode and a special mode, in one embodiment. The normal mode is triggered when data for some memory location is to actually be stored to that memory location, in one embodiment. The special mode is triggered when data for some memory location will not actually be stored at that memory location, in one embodiment. The special mode is triggered when a memory location is to be initialized, in one embodiment. With reference to FIG. 6, the device 20 sets the value for the mode information to reflect whether this is the normal mode or the special mode, in one embodiment. For example, the device may write the value to input mode register 604.

Step 504 is performed when in the normal mode. In step 504, normal data 302 and normal data parity 304 are encoded into a normal data sub-codeword 310. With reference to FIG. 6, the contents of input data register 602 are transferred to the normal data register 602. The contents of input data register 602 are also input to the normal data encoder 402, which outputs the normal data parity 304. The normal data parity 304 is stored in the normal data parity register 604. Prior to discussing the case in which the mode is special (step 506), steps 508-512 will be discussed for the normal mode.

Note that the contents of input data register 602 could have been previously placed there when the device 20 determined that some data was to be stored to memory. For example, the device 20 may use memory for memory management, such as translation tables. The normal data 302 in step 504 may be such memory management, as one example. However, the normal data is not required to be data that the device 20 stores for memory management. It is possible that the normal data 302 is data that the host 2 requested be stored in memory. For example, data from host 2 that is eventually to be stored in non-volatile memory 24 may be temporarily stored in volatile memory 44.

Step 508 includes encoding mode information 306 and mode parity 308 into a mode sub-codeword 312. With reference to FIG. 6, the contents of the input mode register 604 is transferred to the mode register 606a, to be used as mode information 306. The contents of the input mode register 604 is also input to the mode encoder 406, which generates mode parity 308. The mode parity 308 is stored in the mode parity register 608a.

Step 510 includes forming a codeword from the two sub-codewords previously formed. In the normal mode, this refers to the sub-codeword formed in step 504 and the sub-codeword formed in step 508. With reference to FIG. 6 registers 602, 604, 606a, and 608a are connected to one input of MUX 420. Note that registers 624, 626, 606b, and 608b are connected to the other input of MUX 420. Also, the output of the input mode register 604 is used as a select signal for the MUX 420. Thus, the MUX 420 selects either the contents of registers 602, 604, 606a, and 608a or registers 624, 626, 606b, and 608b, depending on the mode. The MUX 420 outputs to the output codeword register 650. Thus, the output codeword register 650 will contain the normal codeword 300 in the normal mode.

Prior to discussing step 512, process 500 will be discussed with respect to an example of the special mode. In the special mode, step 506 is performed. In step 506, special data 324 and special data parity 326 are encoded into a special data sub-codeword 328. The special data 324 can be used to trigger certain functionality upon decoding the special data sub-codeword 328. For example, the special data 324 can be used to initialize memory locations without actually writing data to those locations.

With reference to FIG. 6, the contents of input special data register 606 are transferred to the special data register 624. The contents of input special data register 606 are also input to the special data encoder 404, which outputs the special data parity 326. The special data parity 326 is stored in the special data parity register 626.

Step 508 is similar to the normal mode. With reference to FIG. 6, the contents of the input mode register 604 is transferred to the mode register 606b, to be used as mode information 306. The contents of the input mode register 604 are also input to the mode encoder 406, which generates mode parity 308. The mode parity 308 is stored in the mode parity register 608b.

Step 510 includes forming a codeword from the two sub-codewords previously formed. In the special mode, this refers to the sub-codeword formed in step 506 and the sub-codeword formed in step 508. With reference to FIG. 6 registers 624, 626, 606b, and 608b are selected by MUX 420. The MUX 420 outputs to the output codeword register 650. Thus, the output codeword register 650 will contain the special codeword 320 in the special mode.

Step 512 is to store to codeword to memory. Note that step 512 applies to both the normal mode and the special mode. In one embodiment, volatile memory controller 42 stores the codeword in the output codeword register 650 to volatile memory 44 on the device 20. In one embodiment, volatile memory controller 42 stores the codeword in the output codeword register 650 to host memory 8 (e.g., to host memory assigned to device 8A). In one embodiment, non-volatile memory controller 22 stores the codeword in the output codeword register 650 to non-volatile memory 24 on the device 20. Note that storing to memory in this context means to provide the codeword to the memory, along with one or more memory locations at which to store to codeword. The location refers to a starting location. The amount of data to be stored at the location can be expressly stated or implied. As will be explained below, the codeword can be broken into two or more pieces, which may be stored at different locations.

Figure 7A:
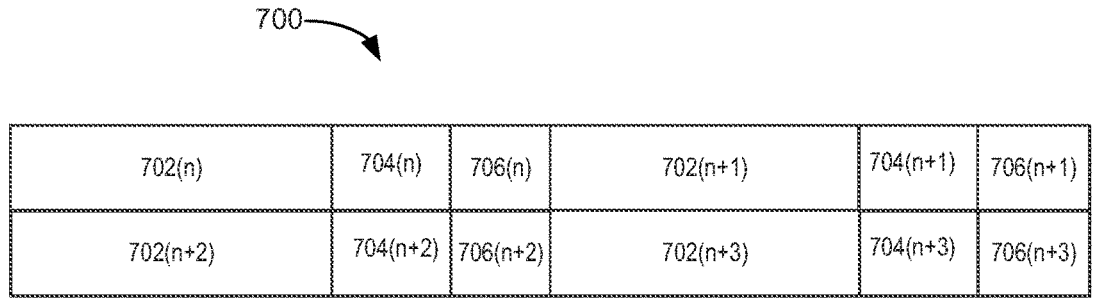
FIG. 7A depicts one possible organization of the various sub-codewords in memory.
Figure 7B:
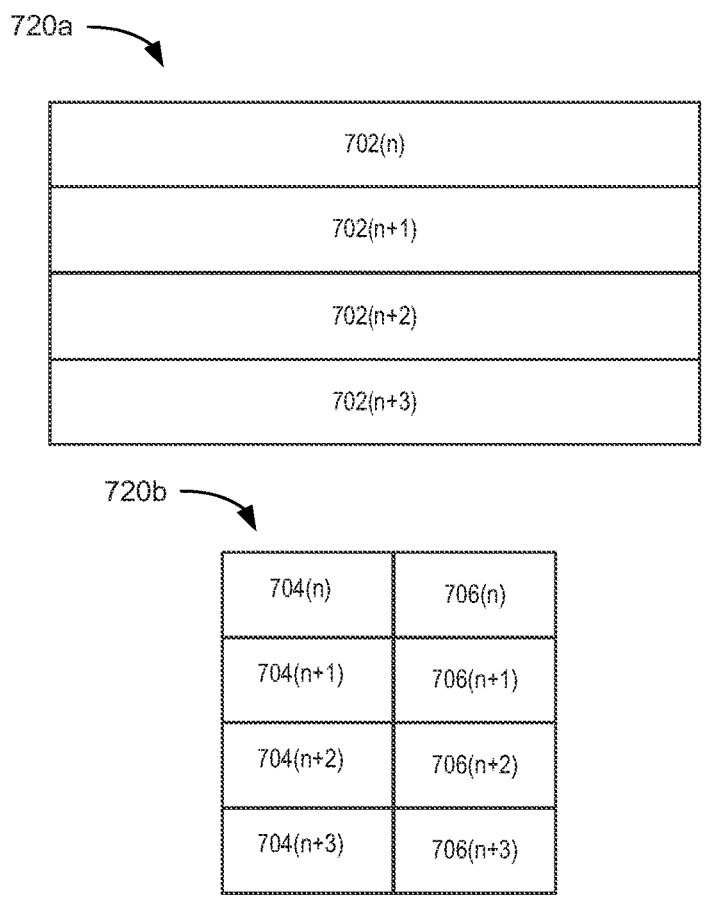
FIG. 7B depicts another possible organization of the various sub-codewords in memory.

FIGS. 7A and 7B provide examples of how the codewords can be stored to memory in step 512, as well as later read back from memory. FIG. 7A depicts one possible organization of the various sub-codewords in memory. The organization is a repeating pattern have a first region 702, second region 704, and third region 706. Four sets of first regions 702, second regions 704, and third regions 706 are depicted. Each set of regions (702, 704, 706) is associated with a fundamental unit of data, in one embodiment.

Collectively, each set of regions stores one normal codeword 300, in one embodiment. In the event that the output codeword is a normal codeword 300, the normal data 302 may be stored in region 702(n), the normal data parity 304 may be stored in region 704(n), and the mode sub-codeword 312 may be stored in region 706(n). In the event that the output codeword is a special codeword 320, no data needs to be stored in any of regions 702. For example, region 702(n+1) does not need to be written. The special data sub-codeword 328 may be stored in region 704(n+1), and the mode sub-codeword 312 may be stored in region 706(n+1).

FIG. 7B depicts another possible organization of the various sub-codewords in memory. The organization has a block 720a for regions 702, and block 720b for regions 704 and 706. Regions 702, 704, and 706 may be used to store similar information as in the example of FIG. 7A. Thus, in the event that the output codeword is a normal codeword 300, the normal data 302 may be stored in region 702(n), the normal data parity 304 may be stored in region 704(n), and the mode sub-codeword 312 may be stored in region 706(n). In the event that the output codeword is a special codeword 320, no data needs to be stored in any of regions 702. For example, region 702(n+1) does not need to be written. The special data sub-codeword 328 may be stored in region 704(n+1), and the mode sub-codeword 312 may be stored in region 706(n+1).

Figure 8:
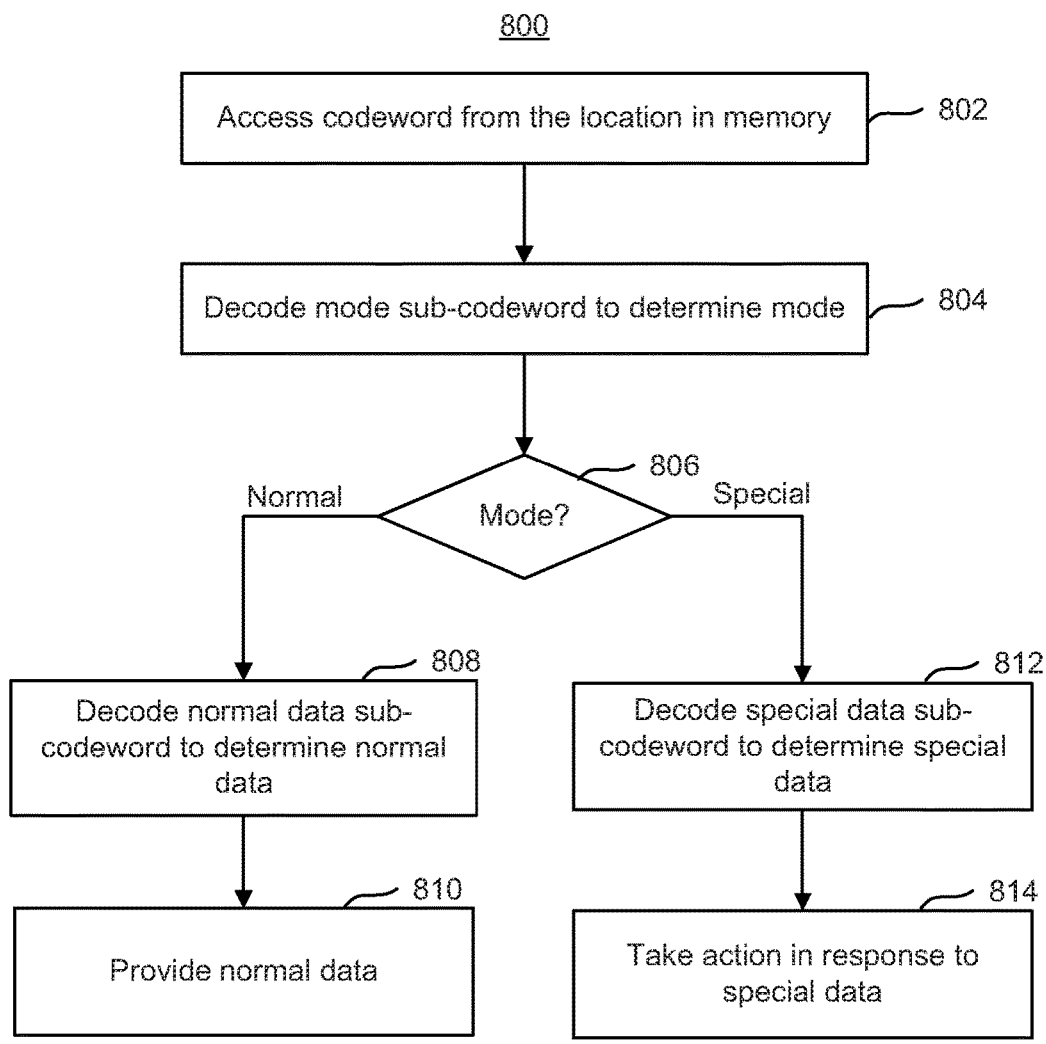
FIG. 8 is a flowchart of one embodiment of a process of decoding data.

FIG. 8 is a flowchart of one embodiment of a process 800 of decoding data. The process 800 is used in combination with process 500, in one embodiment. For example, process 800 may be used to decode data that was stored using process 500. The process 800 may be performed by one or more of volatile memory controller 42, non-volatile memory controller 22, controller 122, normal data decoder 412, special data decoder 414, mode decoder 416, codeword reader 424 and/or mode actor 426. When describing process 800, steps will be described as being performed by device 20.

Figure 9:
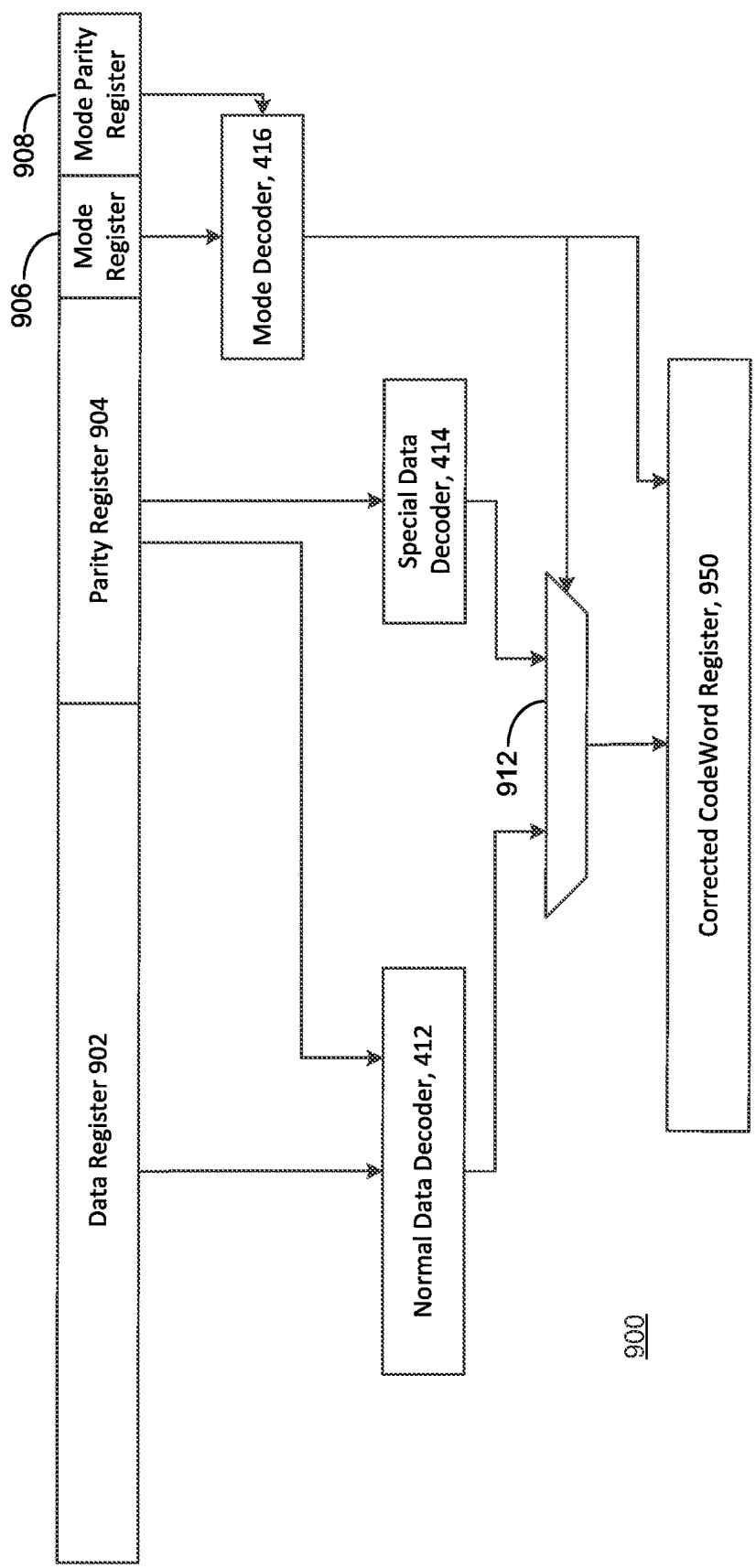
FIG. 9 depicts one embodiment of a system for decoding codewords.

When describing process 800, reference will be made to FIG. 9, which depicts one embodiment of a system 900 for decoding codewords. Briefly, FIG. 9 shows a normal data decoder 412, special data decoder 414, mode decoder 416, MUX 912. The data register 902, parity register 904, mode register 906, and mode parity register 908 are registers or the like, which are used to store various information read from the memory. The corrected codeword register 950 is used to hold the corrected data. Depending on the mode, the corrected codeword register 950 could hold either normal data 302 or special data 324.

The process 800 may be initiated in response to a request to access some location in memory. The request could come from host 2. The request could be initiated by some logic within device 20. For example, the request could be initiated by control layer 222. As one example, the request could be to read a table that translates from logical addresses to physical addressees, as a part of managing non-volatile storage 24. Many other possibilities exist for the source of the request. With reference to FIG. 7A or 7B, the request may be to read data for one of the regions 702. Thus, the request may specify a location for one of the regions 702. In one embodiment, the request either specifies or implies a length that is equal to the length of regions 702 (regions 702 are each the same size, in one embodiment). As noted above, when storing a normal codeword 300 data is stored in one of the regions 702. However, when storing a special codeword 320 it is not required that data be stored in one of the regions 702. This means that data might not have actually been stored at the location to be read.

Step 802 is to access a codeword from the location in memory. Step 802 includes accessing at least two sub-codewords in one embodiment. With reference to either FIG. 7A or 7B, the data associated with one set of regions 702, 704, and 706 may be accessed. A hypothetical will be discussed in which regions 702(n+2), 704(n+2), and 706(n+2) are accessed. Note that regions 702(n+2), 704(n+2), and 706(n+2) could refer to either the example of FIG. 7A or the example of FIG. 7B.

Step 804 includes decoding the mode sub-codeword 312 to determine the mode. With reference to FIG. 9, the data accessed from region 706(n+2) is split between the mode register 906 and the mode parity register 908. The split is performed in accordance with how many mode bits are in the mode information 306 and the number of bits of mode parity 308. Thus, the mode register 906 contains the raw (uncorrected) mode information 306, and the mode parity register 908 contains the mode parity 308. The raw (uncorrected) mode information 306 and the mode parity 308 are input to the mode decoder 416, which performs error detection and/or correction. The mode decoder 416 outputs the decoded (and possibly corrected) mode information 306.

Process 800 then branches at step 806 depending on the mode. First, the normal mode will be discussed. In step 808, the normal data sub-codeword is decoded to determine normal data. With reference to FIG. 9 and either FIG. 7A or 7B, the information accessed from region 702(n+2) is stored into the data register 902, in one embodiment. With reference to FIG. 8 and either FIG. 7A or 7B, the information accessed from region 704(n+2) is stored into the parity register 904, in one embodiment. The information from the data register 902 is input to the normal data decoder 412, along with the information from the parity register 904. The normal data decoder 412 interprets the information in the data register 902 as raw normal data 302, and interprets the information from the parity register 904 as normal data parity 304, in one embodiment. The normal data decoder 412 outputs corrected normal data 302 to one input of MUX 912. The mode information is input as a select signal to the MUX 912 to select the information from the normal data decoder 412, which is provided to the corrected codeword register 950. Thus, the corrected codeword register 950 contains corrected normal data 302.

Step 810 includes providing the normal data 302 to a requestor. The normal data might be provided to host 2 or to some component of device 20. For example, the normal data might be provided to host processor 4, control layer 232, media management layer 238, etc.

Next, the branch for the special mode will be discussed. A hypothetical will now be discussed in which regions 702(n+3), 704(n+3), and 706(n+3) are accessed in step 802. Note that regions 702(n+3), 704(n+3), and 706(n+3) could refer to either the example of FIG. 7A or the example of FIG. 7B. In this example, decoding the mode sub-codeword 312 reveals the special mode. In the special mode, the special data sub-codeword 328 is decoded in step 812. With reference to FIG. 9 and either FIG. 7A or 7B, the information accessed from region 704(n+3) is stored into the parity register 904, in one embodiment. In this example, the information from region 704(n+3) is a special data sub-codeword 328. This information in the parity register 904 is provided to the special data decoder 414. With reference to the example in FIG. 3B, the special data decoder 414 interprets certain bits as being raw special data 324 and certain bits as being special data parity 326, in one embodiment. The special data decoder 414 outputs corrected special data 324 to one input of MUX 912. The mode information is input as a select signal to the MUX 912 to select the information from the special data decoder 414, which is provided to the corrected codeword register 950. Thus, the corrected codeword register 950 contains corrected special data 324.

Step 814 includes taking some action in response to the special data 324. One example is to determine a data pattern based on the special data 324. For example, there could be one or more data patterns that could be selected based on the value of the special data 324. Examples of data patterns include, but are not limited to, all zeros, all ones, a pattern of alternative ones and zeros, etc. In one embodiment, the data pattern has the same number of bits as region 702(n+3). In one embodiment, the data pattern has the same number of bits as normal data 302, were this to be the normal mode. Note that whatever data was read from region 702(n+3) may be ignored in the special mode. In one embodiment, the data pattern is substituted for the data read from region 702(n+3), and provided to a requester of data associated with region 702(n+3).

In one embodiment, the pattern used in step 814 is used to initialize the memory to valid values. For example, valid values could be all zeroes. In one embodiment, the pattern used in step 814 is used to initialize the memory such that an exception is triggered. For example, rather than initializing the memory to a valid pattern, the pattern may be an invalid one that will trigger an exception. For example, when a component such as host 2 receives the invalid pattern, the host 2 may determine that the memory was not properly initialized.

Note that the combination of process 500 and 800 allows the device 20 to store much less information to memory in step 512 (for the special mode) than is provided to requestor in step 814. In one embodiment, this is used to vastly reduce the time needed to initialize memory. Initialize memory, as the term is used herein, means to establish values for various locations in memory.

Note that many products containing memory are required to meet maximum latency requirements out of cold-boot or different low-power states. As part of the latency requirements, the product may initialize its memory to some known state. Embodiments of device 20 significantly reduce memory initialization time.

Some examples of fast memory initialization will now be discussed with respect to the examples of FIGS. 7A and 7B. In one embodiment, when a normal codeword 300 is stored, normal data 302 may be stored in region 702; normal data parity 304 may be stored in region 704; and the mode sub-codeword 312 may be stored in region 706. Note that the size of the normal data 302 can vary depending on implementation. Also, the number of normal parity bits can vary depending on the number of bits of normal data, as well as strength of error correction. Moreover, the codeword typically needs to be aligned to some fundamental size, based on various architectural considerations. Table I shows examples of initialization time improvement for various factors.

TABLE I

| Data Size | Data Parity Size | Alignment Bits | Codeword Size | Improvement |
|---|---|---|---|---|
| 1 Byte | 5 Bits | 3 Bits | 2 Bytes | 2/1 = 2X |
| 2 Bytes | 6 Bits | 2 Bits | 3 Bytes | 3/1 = 3X |
| 4 Bytes | 7 Bits | 1 Bits | 5 Bytes | 5/1 = 5X |
| 16 Bytes | 9 Bits | 7 Bits | 18 Bytes | 18/2 = 9X |
| 32 Bytes | 10 Bits | 6 Bits | 34 Bytes | 34/2 = 17X |
| 64 Bytes | 11 Bits | 5 Bits | 66 Bytes | 66/2 = 33X |
| 128 Bytes | 12 Bits | 4 Bits | 130 Bytes | 130/2 = 65X |
| 256 Bytes | 13 Bits | 3 Bits | 258 Bytes | 258/2 = 129X |
| 512 Bytes | 14 Bits | 2 Bits | 514 Bytes | 514/2 = 257X |
| 1024 Bytes | 15 Bits | 1 Bits | 1026 Bytes | 1026/2 = 513X |

In Table I, the data size refers to a fundamental unit of data. This corresponds to the normal data 302, in one embodiment. The data parity size refers to the number parity bits needed to achieve some level of error detection and/or correction. For example, this may be the number of parity bits needed for single error correction-dual error detection. The data parity size corresponds to the normal data parity 304, in one embodiment. The alignment bits refer to the number of bits that are needed to align the codeword on some boundary (such as a Byte). For example, for the example in which there are 128 Data Bits, and 12 Parity Bits, 4 Alignment bits are needed to align the codeword on a 130 Byte boundary. In some embodiments, the alignment bits correspond to the mode sub-codeword 312. For example, the mode sub-codeword 312 can be placed into the portion of the codeword that is not needed for normal data and normal data parity, but might be otherwise wasted. In the 128 Data Bit example, the initialization may be about 65 times faster. This is due to only needing to store 2 Bytes instead of 130 Bytes. The 2 Bytes corresponds to the combination of the special codeword 320. Note that the special data sub-codeword 328 may be 12 bits in this example, and the mode sub-codeword 312 may be four bits in this example.

For some codewords, it is possible to fit the entire mode sub-codeword 312 within the extra bits provided for alignment. In such cases, it is possible to encode and store each codeword independently of one another. For other codewords, there are insufficient additional bits from alignment to fit the entire mode sub-codeword 312. In one embodiment, the mode sub-codeword 312 is distributed across the alignment bits from multiple codewords.

Figure 10:
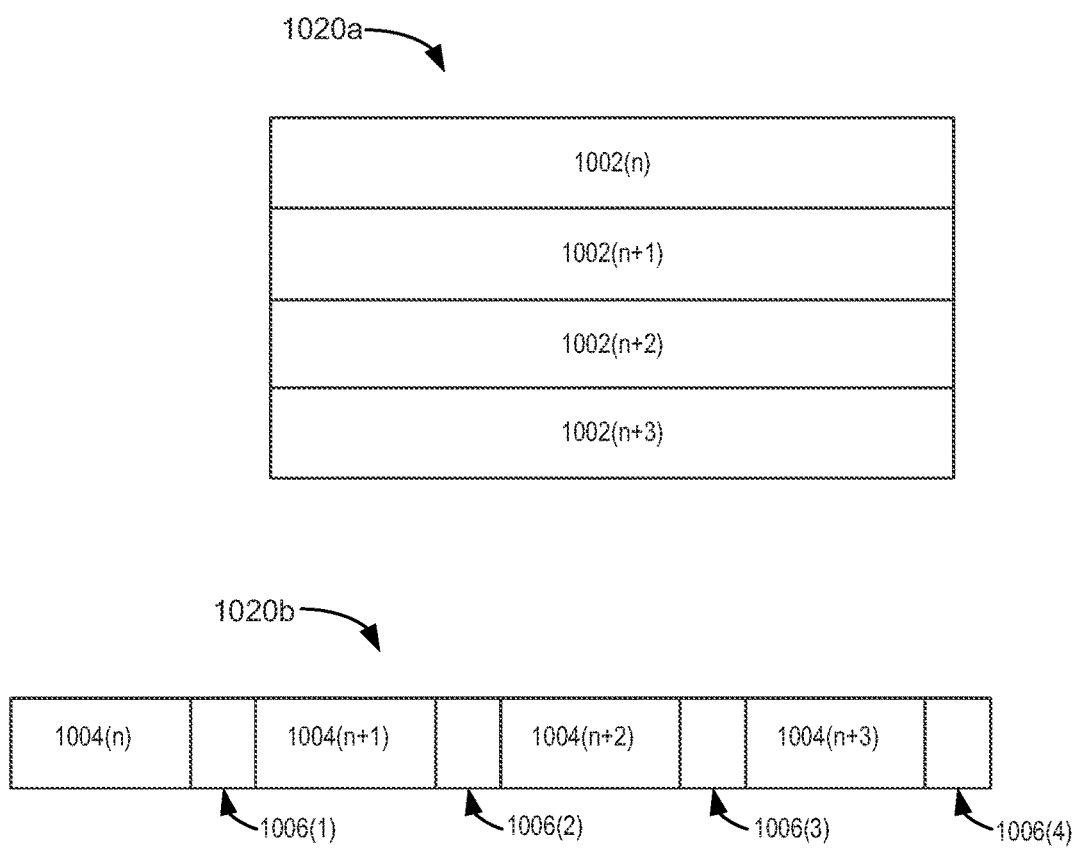
FIG. 10 depicts one embodiment of how codewords may be stored to memory to illustrate.

FIG. 10 depicts one embodiment of how codewords may be stored to memory to illustrate. The memory is organized into a first block 1020a that contains the first regions 1002, and a second block 1020b that contains second regions 1004, and third regions 1006. In the event that the output codeword is a normal codeword 300, the normal data 302 may be stored in one of the first regions (e.g., 1002(n)), and the normal data parity 304 may be stored in the corresponding second region 1004(n). However, in this embodiment, the mode sub-codeword 312 is too large to fit into a single third region 1006. Thus, the mode sub-codeword 312 is distributed across multiple third regions 1006. Thus, in this example, the mode sub-codeword 312 is written to regions 1006(1), 1006(2), 1006(3) and 1006(4). Thus, the mode sub-codeword 312 may be common to the four codewords written to the regions depicted in FIG. 10.

In the event that the output codeword is a special codeword 320, no data needs to be stored to any of the first regions 1002. The special data sub-codeword 328 may be stored to one of the second regions (e.g., region 1004(n+2). The mode sub-codeword 312 is distributed across the four third regions 1006(1) to 1006(4), in this example of a special codeword 320.

When the data at, for example, locations 1002(n+2) is to be read, the device 20 may read first region 1002(n+2), all four second regions 1004(n) to 1004(n+3), and all four third regions 1006(1) to 1006(4), in this example. Note that in some embodiments, the size of all four second regions 1004(n) to 1004(n+3), and all four third regions 1006(1) to 1006(4) are read together due to minimum burst restrictions of the memory interface.

A first embodiment disclosed herein includes an apparatus comprising an encoder configured to encode data into a first sub-codeword and mode information into a second sub-codeword; a codeword writer configured to write the first sub-codeword and the second sub-codeword to non-transitory storage; a codeword reader configured to read the first sub-codeword and the second sub-codeword from the non-transitory storage; and a decoder configured to decode the second sub-codeword read from the non-transitory storage to obtain the mode information, and to decode the first sub-codeword read from the non-transitory storage based on the mode information.

In a second embodiment, and in furtherance of the first embodiment, the encoder is configured to encode a normal mode as the mode information in response to the data being normal data, and to encode a special mode as the mode information in response to the data being special data.

In a third embodiment, and in furtherance of the second embodiment, the normal data contains more bits than the special data.

In a fourth embodiment, and in furtherance of any of the first to third embodiments, the encoder is encoder configured to encode "m" data bits and "n" parity bits into the first sub-codeword in response to the mode information indicating a normal data mode. The encoder is further configured to encode a total of "n" bits for data and parity bits into the first sub-codeword in response to the mode information indicating a special data mode.

In a fifth embodiment, and in furtherance of the fourth embodiment, the codeword writer is configured to store the "m" data bits and the "n" parity bits for the first sub-codeword to the non-transitory storage in response to the mode information indicating the normal data mode. The codeword writer is further configured to store only the "n" bits for data and parity for the first sub-codeword to the non-transitory storage in response to the mode information indicating the special data mode.

In a sixth embodiment, and in furtherance of the fifth embodiment, the decoder is configured to: decode the "m" data bits and the "n" parity bits that were stored to the non-transitory storage as the first sub-codeword in response to the mode information indicating the normal data mode; and decode the "n" bits that were stored to the non-transitory storage as the first sub-codeword in response to the mode information indicating the special data mode.

A seventh embodiment, and in furtherance of the sixth embodiment, further comprises a mode actor configured to determine an "m" bit data pattern based on the data bits of the first sub-codeword in response to the mode information indicating the special data mode; and substitute the "m" bit data pattern for "m" bits on the non-transitory storage.

In an eighth embodiment, and in furtherance of the first embodiment, the codeword writer is further configured to store the first sub-codeword and the second sub-codeword to a first location in non-transitory storage without storing anything to a second location in the non-transitory storage in response to the mode information indicating a special mode; and the codeword reader is further configured to read at least the first location of the non-transitory storage to obtain the first sub-codeword and the second sub-codeword in response to a request for data for the second location.

In a ninth embodiment, and in furtherance of the eighth embodiment, the decoder is further configured to decode the second sub-codeword that was read from the first location to identify the special mode, decode the first sub-codeword to obtain special data, and to determine a data pattern for the second location based on the special data. The apparatus further comprises a communication interface configured to provide the data pattern in response to the request for data for the second location, in the ninth embodiment.

One embodiment includes a method comprising: encoding data and data parity into a first sub-codeword; encoding mode information and mode parity into a second sub-codeword; storing the first sub-codeword and the second sub-codeword in non-transitory storage; accessing at least the first sub-codeword and the second sub-codeword from the non-transitory storage; decoding the second sub-codeword that was accessed from the non-transitory storage to obtain the mode information; and decoding the first sub-codeword that was accessed from the non-transitory storage based on the mode information.

One embodiment includes a non-volatile storage device comprising: non-transitory storage; data encoding means for encoding data and data parity into a first sub-codeword; mode encoding means for encoding mode information and mode parity into a second sub-codeword; codeword storing means for storing the first sub-codeword and the second sub-codeword in the non-transitory storage; codeword reading means for accessing the first sub-codeword and the second sub-codeword from the non-transitory storage; mode decoding means for decoding the second sub-codeword that was accessed from the non-transitory storage to obtain the mode information; and data decoding means for decoding the first sub-codeword that was accessed from the non-transitory storage based on the mode information.

In one embodiment, the data encoding means comprises one or more of processor 134, encoders 242, normal data encoder 402, special data encoder 404, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

In one embodiment, the mode encoding means comprises one or more of processor 134, encoders 242, mode encoder 406, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

In one embodiment, the codeword storing means comprises one or more of processor 134, codeword former 420, codeword writer 422, memory interface 230, interface 30, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

In one embodiment, the codeword reading means comprises one or more of processor 134, codeword reader 424, memory interface 230, interface 30, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

In one embodiment, the mode decoding means comprises one or more of processor 134, decoders 244, mode decoder 416, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

In one embodiment, the data decoding means comprises one or more of processor 134, decoders 244, normal data decoder 412, special data decoder 414, a packaged functional hardware unit (e.g., an electrical circuit) designed for use with other components, program code (e.g., software or firmware) executable by a (micro) processor, an application specific integrated circuit (ASIC), a Field Programmable Gate Array (FPGA), an electrical circuit, a digital logic circuit, an analog circuit, a combination of discrete circuits, gates, or any other type of hardware or combination thereof.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus comprising:
   non-transitory storage; and
   a control circuit configured to:
      form codewords that each comprise a first sub-codeword and a second sub-codeword, the first sub-codeword comprises data and data parity, the second sub-codeword of each of the codewords comprises mode information and mode parity;
      write the codewords to the non-transitory storage;
      read the codewords from the non-transitory storage;
      decode the second sub-codeword in each of the codewords read from the non-transitory storage to obtain a corresponding mode information;
      decode the first sub-codeword in a first set of the codewords read from the non-transitory storage using a first decoding technique to determine the data when the corresponding mode information indicates a first mode; and
      decode the first sub-codeword in a second set of the codewords read from the non-transitory storage using a second decoding technique to determine the data when the corresponding mode information indicates a second mode.

2. The apparatus of claim 1, wherein the control circuit is further configured to specify the first mode as the mode information in the second sub-codeword in response to the data being normal data, and to specify the second mode as the mode information in the second sub-codeword in response to the data being special data.

3. The apparatus of claim 2, wherein the normal data contains more bits than the special data.

4. The apparatus of claim 1, wherein:
   the first sub-codeword comprises m bits for the data and n bits for the data parity when the mode information indicates the first mode, wherein m is a first integer and n is a second integer; and
   the first sub-codeword comprises a total of n bits for both the data and the data parity when the mode information indicates the second mode.

5. The apparatus of claim 4, wherein the control circuit is further configured to:
   store the m bits for the data and the n bits for the data parity for the first sub-codeword to the non-transitory storage in response to the mode information indicating the first mode; and
   store only the n bits for the both the data and the data parity for the first sub-codeword to the non-transitory storage in response to the mode information indicating the second mode.

6. The apparatus of claim 5, wherein the control circuit is further configured to:
   decode the m bits and the n bits that were stored to the non-transitory storage as the first sub-codeword in response to the mode information indicating the first mode; and
   decode the n bits that were stored to the non-transitory storage as the first sub-codeword in response to the mode information indicating the second mode.

7. The apparatus of claim 6, wherein the control circuit is further configured to:
   determine an m bit data pattern based on the decoded n bits of the first sub-codeword in response to the mode information indicating the second mode; and substitute the m bit data pattern for m bits on the non-transitory storage.

8. The apparatus of claim 1, wherein the control circuit is further configured to:
store the first sub-codeword and the second sub-codeword to a first location in the non-transitory storage without storing anything to a second location in the non-transitory storage in response to the mode information indicating the second mode; and
read at least the first location of the non-transitory storage to obtain the first sub-codeword and the second sub-codeword in response to a request for data for the second location.

9. The apparatus of claim 8, wherein the control circuit is further configured to:
decode the second sub-codeword that was read from the first location to identify the second mode, decode the first sub-codeword to obtain special data in responsive to the second mode, and determine a data pattern for the second location based on the special data, and
provide the data pattern in response to the request for data for the second location.

10. A method comprising:
forming a first sub-codeword that comprises data and data parity;
forming a second sub-codeword that comprises mode information and mode parity;
storing the first sub-codeword and the second sub-codeword in non-transitory storage;
accessing at least the first sub-codeword and the second sub-codeword from the non-transitory storage;
decoding the second sub-codeword that was accessed from the non-transitory storage to obtain the mode information; and
decoding the first sub-codeword that was accessed from the non-transitory storage based on the mode information, including using a first decoding technique when the mode information indicates a normal data mode and using a second decoding technique when the mode information indicates a special data mode.

11. The method of claim 10, wherein forming the first sub-codeword comprises:
encoding m data bits to generate n parity bits, wherein m is a first integer and n is a second integer;
forming the first sub-codeword from the m data bits and the n parity bits in response to the mode information specifying the normal data mode;
encoding special data to generate parity for the special data, the special data and the parity for the special data together being n bits; and
forming the first sub-codeword from the special data and the parity for the special data in response to the mode information specifying the special data mode.

12. The method of claim 11, wherein forming the second sub-codeword comprises:
including an indication of the normal mode as the mode information in response to the data being normal data; and
including an indication of the special mode as the mode information in response to the data being the special data, wherein the special data contains fewer bits than the normal data.

13. The method of claim 12, wherein storing the first sub-codeword and the second sub-codeword in the non-transitory storage comprises:
storing the m data bits and the n parity bits for the first sub-codeword to the non-transitory storage in response to the mode information specifying the normal data mode; and
storing only the special data and the parity for the special data for the first sub-codeword to the non-transitory storage in response to the mode information specifying the special data mode.

14. The method of claim 13, wherein:
accessing at least the first sub-codeword from the non-transitory storage comprises reading m+n bits from the non-transitory storage; and
decoding the first sub-codeword that was accessed from the non-transitory storage based on the mode information comprises: decoding the n bits of the m+n bits read from the non-transitory storage to determine the special data in response to the mode information specifying the special data mode.

15. The method of claim 14, further comprising:
generating m bits based on a value of the special data determined in response to the mode information specifying the special data mode; and
substituting the generated m bits for the m bits read from the non-transitory storage.

16. The method of claim 10, wherein decoding the first sub-codeword based on the mode information comprises:
in response to the mode information being the normal data mode:
i) decoding the first sub-codeword with a first decoder to generate first data; and
ii) providing the first data to a requestor;
in response to the mode information being the special data mode:
i) decoding the first sub-codeword with a second decoder to generate second data; and
ii) based on the second data, determining third data to provide to the requestor.

17. The method of claim 16, wherein the third data has a size that is equal to the first data, wherein the third data has a size that is greater than the second data.

18. A storage device comprising:
volatile memory;
data encoding means for encoding data to generate data parity;
mode encoding means for encoding mode information to generate mode parity;
codeword forming means for forming a first sub-codeword that comprises the data and the data parity, the codeword forming means further for forming a second sub-codeword that comprises the mode information and the mode parity;
codeword storing means for storing the first sub-codeword and the second sub-codeword in the volatile memory;
codeword reading means for accessing the first sub-codeword and the second sub-codeword from the volatile memory;
mode decoding means for decoding the second sub-codeword that was accessed from the volatile memory to obtain the mode information; and
data decoding means for decoding the first sub-codeword that was accessed from the volatile memory based on the mode information, the data decoding means comprising normal data decoding means for decoding the first sub-codeword in response to the mode information indicating a normal data mode, the data decoding means comprising special data decoding means for decoding the first sub-codeword in response to the mode information indicating a special data mode.

19. The storage device of claim 18, wherein:

the data is m bits and the data parity is n bits when the mode information indicates a normal data mode, wherein m is a first integer and n is a second integer;

the data and the data parity are a combined n bits when the mode information indicates a special data mode;

the codeword storing means is further for storing the m bits of the data and the n bits of the data parity for the first sub-codeword to the volatile memory in response to the mode information indicating the normal data mode;

the codeword storing means is further for storing only the n bits of the data and the data parity for the first sub-codeword to the volatile memory in response to the mode information indicating the special data mode;

the normal data decoding means is further for decoding the m bits of the data and the n bits of the data parity that were stored to the volatile memory as the first sub-codeword in response to the mode information indicating the normal data mode; and the special data decoding means is further for decoding the n bits of the data and the data parity that were stored to the volatile memory as the first sub-codeword in response to the mode information indicating the special data mode.

20. The storage device of claim 19, further comprising mode action means for:

receiving the data of the first sub-codeword from the special data decoding means;

determining an m bit data pattern based on the data of the first sub-codeword in response to the mode information indicating the special data mode; and substituting the m bit data pattern for m bits read from the volatile memory.

\* \* \* \* \*